(12) United States Patent
Swanson et al.

(10) Patent No.: US 8,203,197 B2
(45) Date of Patent: Jun. 19, 2012

(54) THERMALLY ENHANCED SEMICONDUCTOR DEVICES

(75) Inventors: Leland Scott Swanson, McKinney, TX (US); Gregory E. Howard, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 267 days.

(21) Appl. No.: 12/758,610

(22) Filed: Apr. 12, 2010

(65) Prior Publication Data

US 2010/0193909 A1 Aug. 5, 2010

Related U.S. Application Data

(63) Continuation of application No. 11/769,470, filed on Jun. 27, 2007, now abandoned.

(51) Int. Cl.
*H01L 21/70* (2006.01)
(52) U.S. Cl. ........... 257/499; 257/539; 361/713; 361/98
(58) Field of Classification Search .................. 257/539, 257/499; 361/713, 98
See application file for complete search history.

(56) References Cited

U.S. PATENT DOCUMENTS

| 5,734,193 | A | * | 3/1998 | Bayraktaroglu et al. | 257/579 |
| 6,051,871 | A | | 4/2000 | DeLaCruz et al. | |
| 6,414,371 | B1 | * | 7/2002 | Freeman et al. | 257/584 |
| 6,426,667 | B1 | * | 7/2002 | Goldman et al. | 327/478 |
| 6,559,534 | B1 | | 5/2003 | Floriot et al. | |
| 2004/0145046 | A1 | | 7/2004 | Yamashita | |

* cited by examiner

*Primary Examiner* — David Vu
*Assistant Examiner* — Brandon Fox
(74) *Attorney, Agent, or Firm* — Warren L. Franz; Wade J. Brady, III; Frederick J. Telecky, Jr.

(57) ABSTRACT

Thermal communication of matched transistors formed in lower electrical resistance subregions of first and second active substrate regions is provided by thermally conductive members formed to extend over isolation regions between higher electrical resistance subregions of the first and second regions. In one form, thermal communication is done, with or without contacts, through insulating layers to metal layers formed over the substrate. In another form, thermal communication is done through a polysilicon layer formed over the substrate.

20 Claims, 7 Drawing Sheets

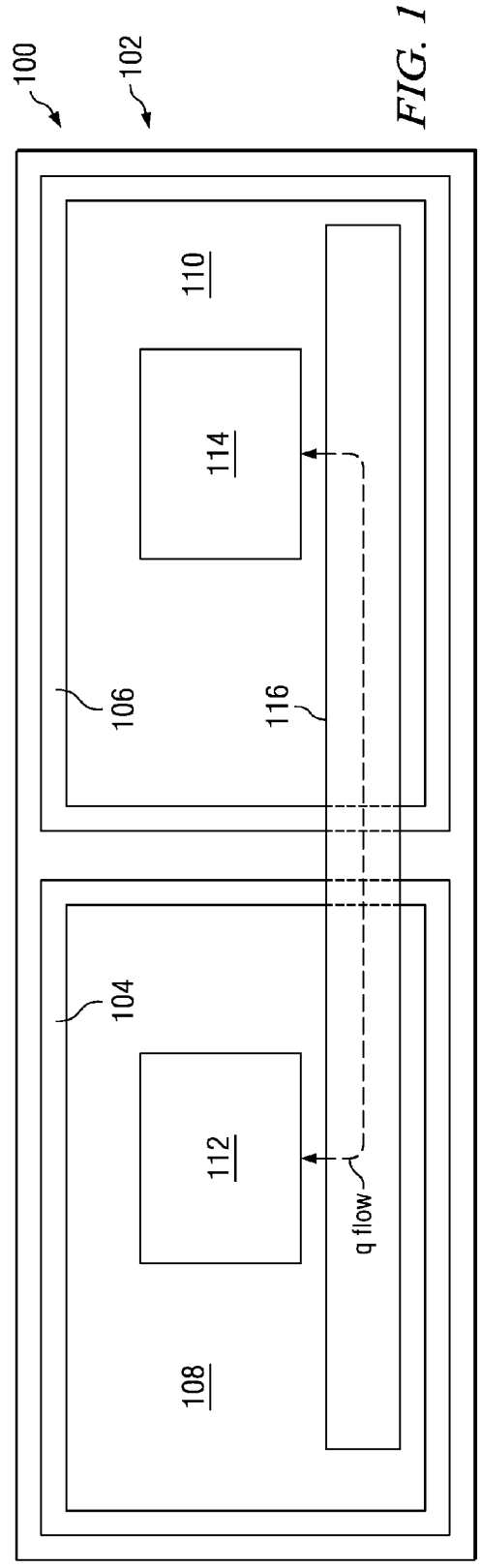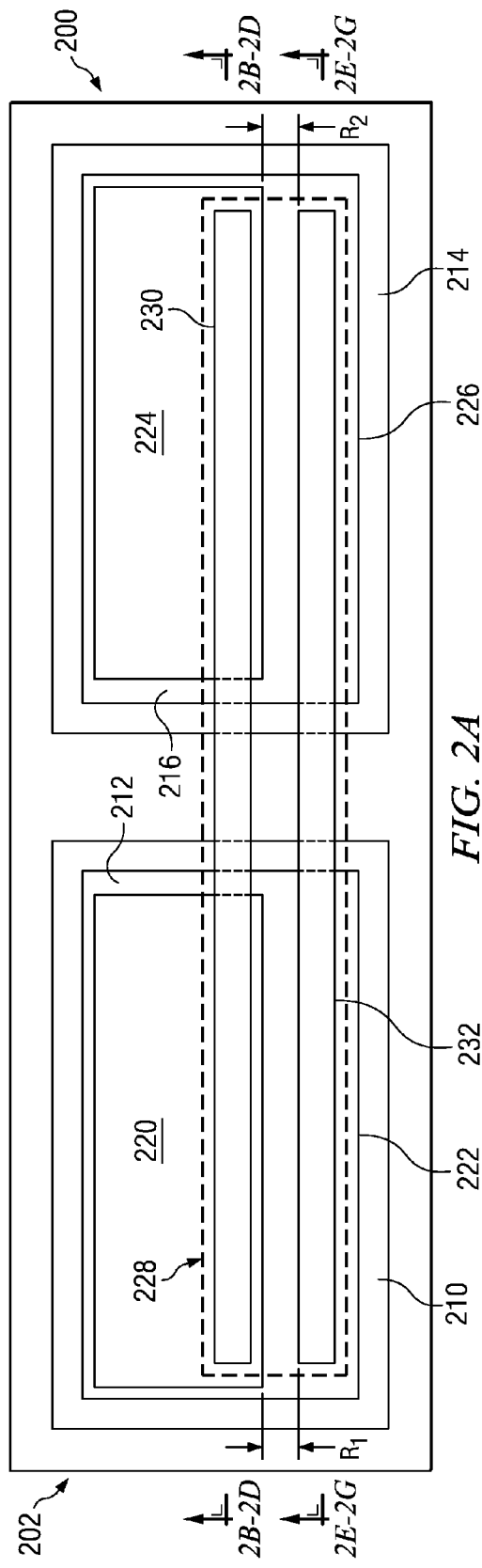

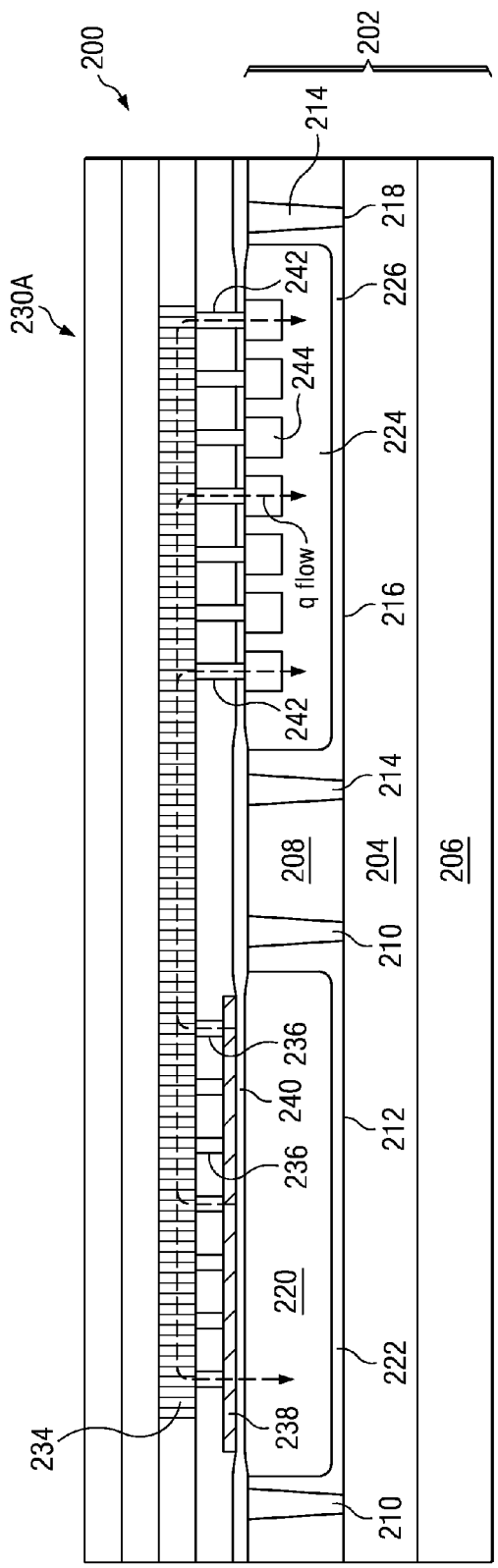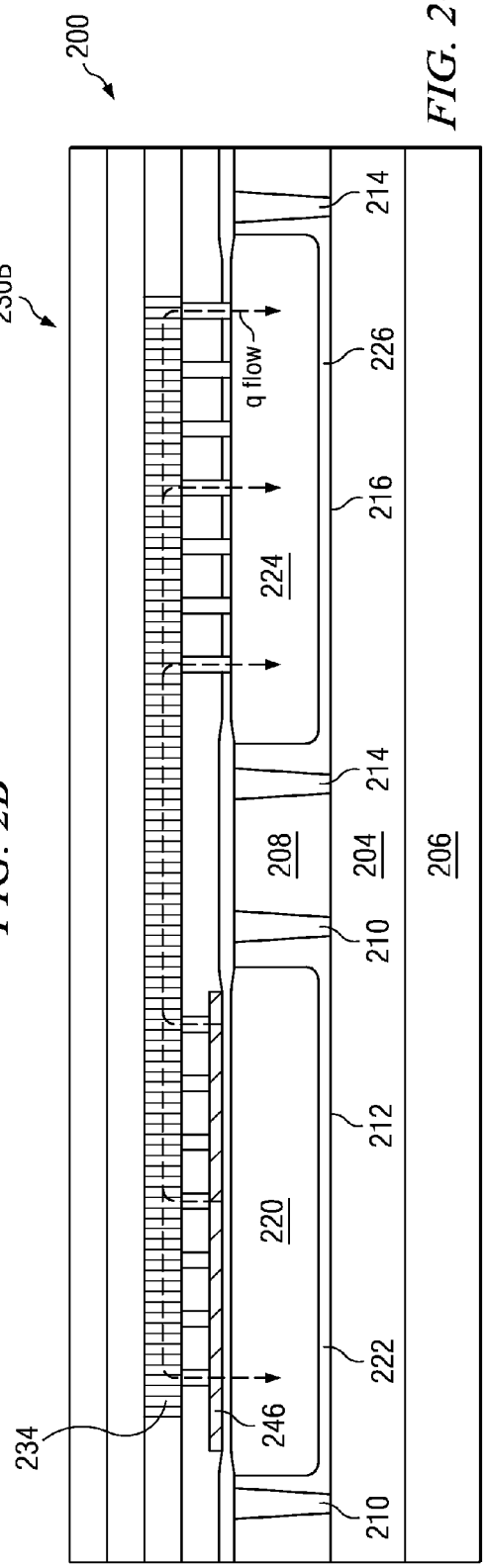
FIG. 2B
FIG. 2C

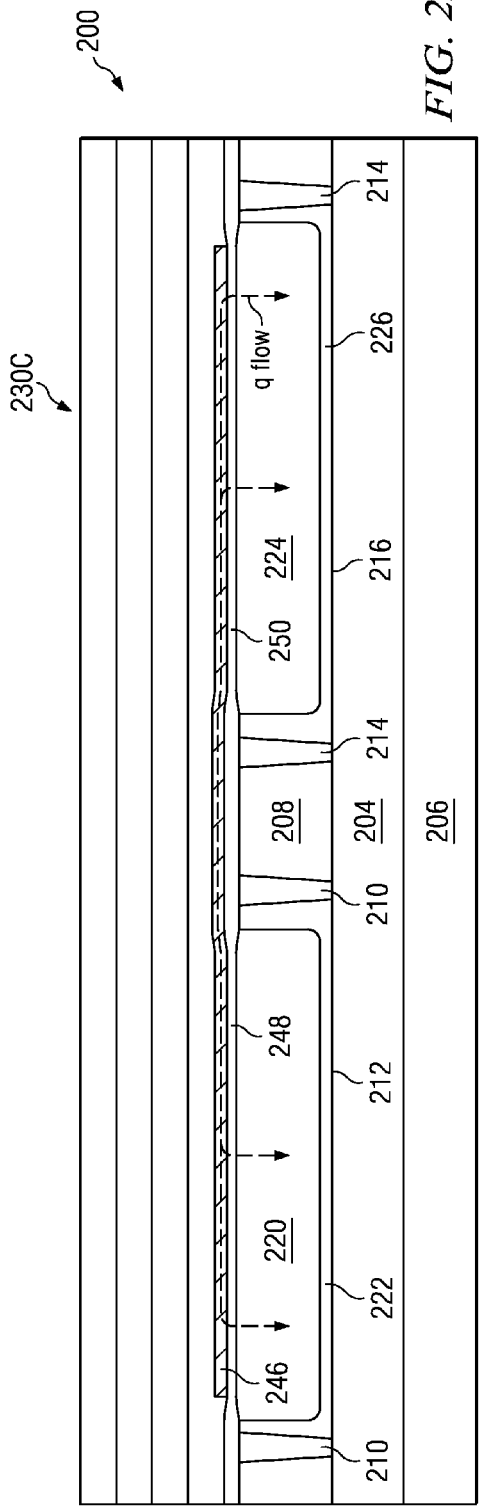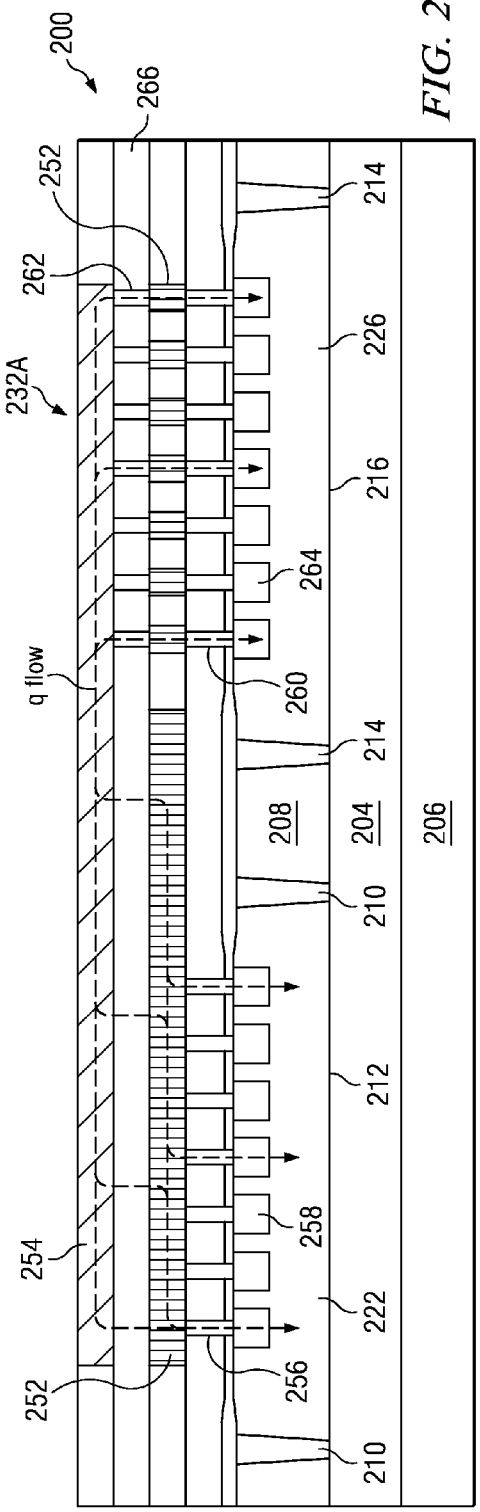

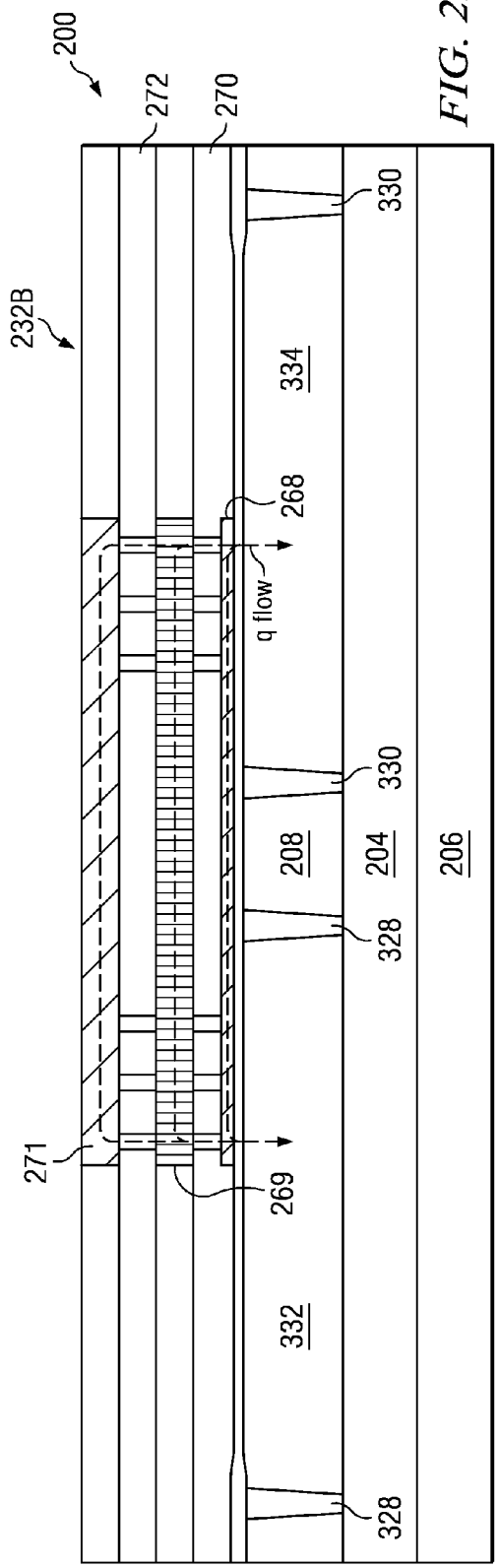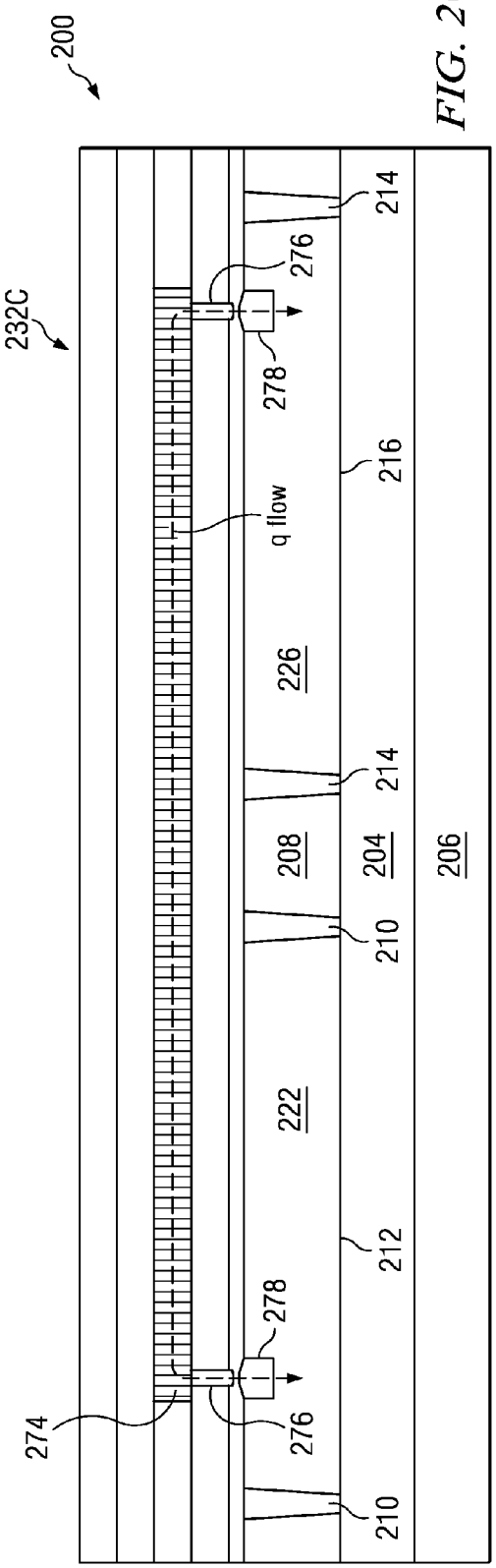

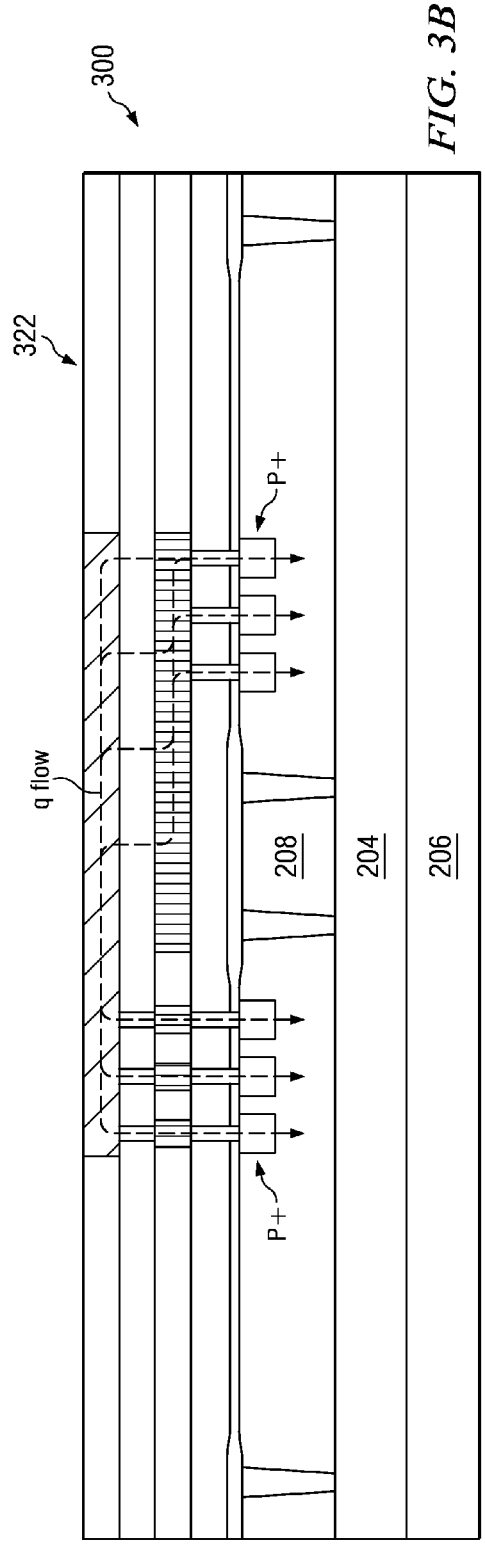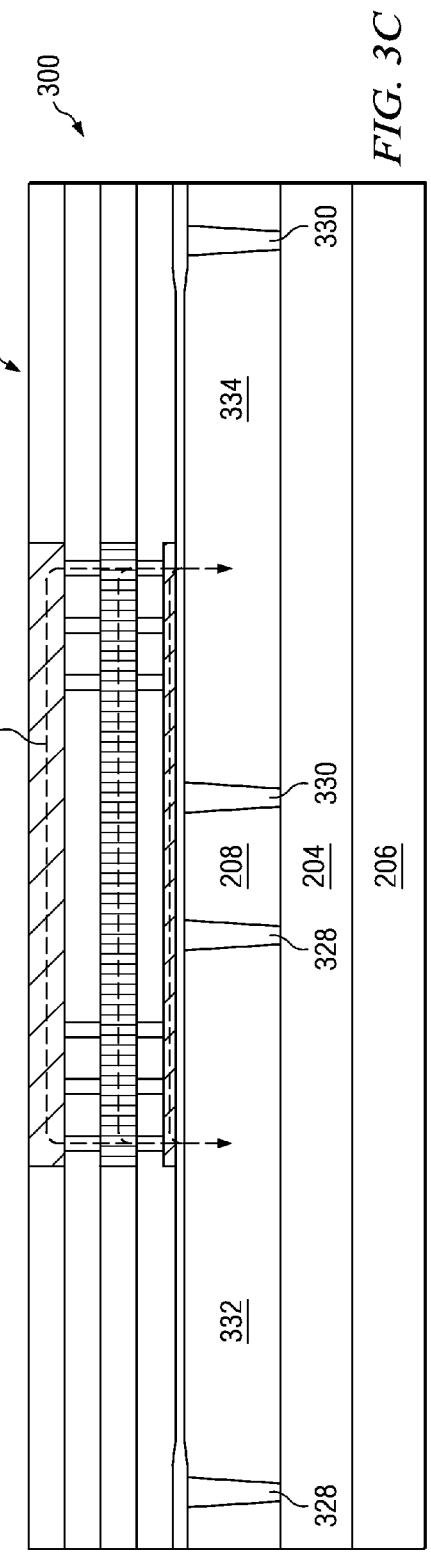

US 8,203,197 B2

THERMALLY ENHANCED SEMICONDUCTOR DEVICES

This application is a continuation of prior application Ser. No. 11/769,470, filed Jun. 27, 2007, the entirety of which is incorporated herein by reference.

BACKGROUND

The invention relates generally to semiconductor devices and more particularly to thermally enhanced semiconductor devices.

In many integrated circuits, designers go to great lengths to match the characteristics of devices, particularly for analog applications. One way in which designers often attempt to "match" two transistors is by matching their geometries (i.e., layouts). By doing this, the transistors experience similar electrical stresses with respect to surrounding devices. Therefore, the two transistors may have similar gains (β), currents delivered ($I_{Ds}$), voltage thresholds ($V_T$), etc.

Even with matched geometries, however, it is still difficult to achieve extremely precise transistor matching over time due to dynamic temperature variations between two matched devices. For example, at any given time one transistor of a matched pair of transistors may draw a much larger current than the other transistor. This large current may cause the transistor or its surrounding structures to heat up more than the other transistor, thereby creating a thermally induced offset (or "thermal drift") between the two devices. This thermally induced offset may vary as a function of time and is particularly problematic between devices where precise matching is desired.

SUMMARY

In one aspect, the invention provides a circuit. In a described circuit, a first semiconductor device with a first geometry is associated with a first region of a semiconductor body within a first isolation structure. A second semiconductor device with a geometry that matches the first geometry is associated with a second region of the semiconductor body within a second isolation structure. A member, which spans the semiconductor body between the first region and the second region, thermally couples the first region to the second region while retaining electrical isolation therebetween.

The following description and annexed drawings set forth in detail certain illustrative aspects and implementations of the invention. These are indicative of but a few of the various ways in which the principles of the invention may be employed.

BRIEF DESCRIPTION OF THE DRAWINGS

FIG. 1 shows one embodiment in accordance with aspects of the invention;

FIGS. 2A-2G show other embodiments in accordance with aspects of the invention;

FIGS. 3A-3C show another embodiment; and

DESCRIPTION OF EXAMPLE EMBODIMENTS

Figure 3A:
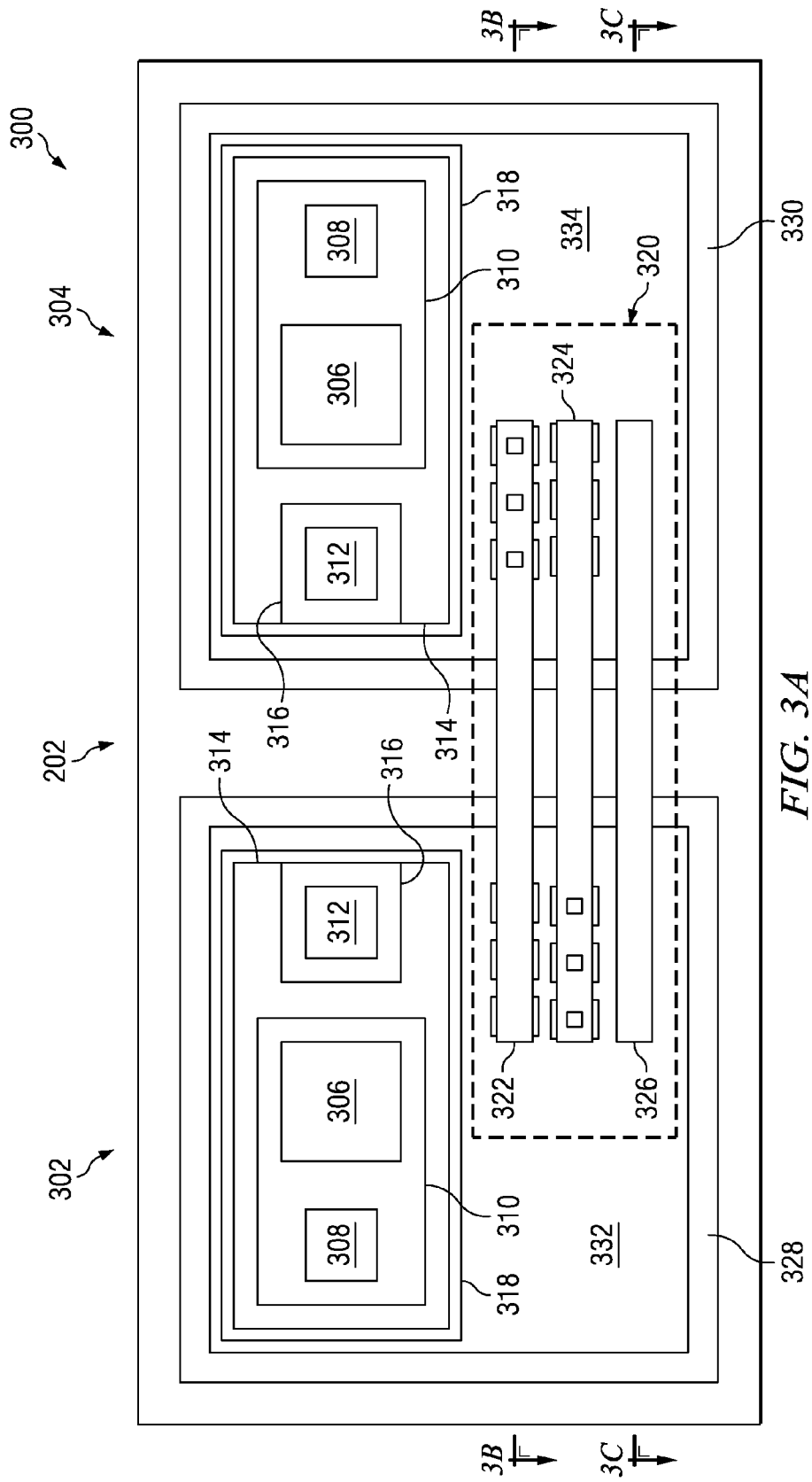

FIG. 1 shows one embodiment of a circuit 100 adapted to facilitate precise matching of device characteristics. The circuit 100 is formed over a semiconductor body 102, which may typically comprise a silicon (Si) wafer, silicon-on-insulator (SOI) structure, gallium arsenide (GaAs) wafer, or some other type of semiconductor substrate. Isolation structures 104, 106, such as isolation trenches, for example, are formed in the semiconductor body and electrically isolate a first region 108 of the semiconductor body from a second region 110 of the semiconductor body. First and second geometrically matched devices 112, 114, are formed within the first and second regions 108, 110, respectively.

During operation, one of the devices (e.g., first device 112) may draw more current than the other device (e.g., second device 114). This increased current can create excess heat in the region associated with the one device (e.g., first region 108). Because the isolation structures 104, 106 typically have a significant thermal resistance, the isolation structures inhibit this heat from quickly dissipating between the regions 108, 110. This could cause heat to build up in one of the regions, thereby causing the one device (e.g., first device 112) to operate at a higher temperature than the other device (e.g., second device 114). Absent countermeasures, this temperature difference between the two geometrically matched devices could cause deviations between their otherwise matched characteristics (e.g., carrier mobility, voltage threshold, PN junction forward bias voltage, etc.).

In order to mitigate this temperature difference, a member 116, which spans the body 102 between the first and second regions, thermally couples the first region 108 to the second region 110. The member 116 has a relatively low thermal resistance and allows heat to efficiently flow (q-flow) between the regions 108, 110. For example, in one embodiment, the member may thermally couple the first and second regions 108, 110 so they are separated by a thermal resistance of less than approximately 100 K-m/W, or even less than 50 K-m/W.

To ensure proper device functionality, the member 116 also retains electrical isolation between the two regions 108, 110. For example, in one embodiment, the member will separate the regions 108, 110 by an effective series R-C electrical reactance of at least approximately 10 kohms at frequencies near the bandwidth of the circuit. For example, in a linear circuit the bandwidth could typically be the frequency where the gain has dropped to unity. In a switching circuit, by contrast, the bandwidth could often be about three to five times that of the switching frequency, although this bandwidth could vary depending on the desired "squareness" of the switched waveform. This configuration allows the characteristics of the first and second devices to closely match one another even if one device draws more current or is otherwise heated more than the other. It will be appreciated that the term "electrically isolates" and variations thereof may include substantial electrical isolation, where there is still some limited electrical coupling between the devices.

In various embodiments, the first and second devices 112, 114 could comprise bipolar junction transistors (BJTs), metal oxide semiconductor field effect transistors (MOSFETs), junction-gate field effect transistors (JFETs), multi-gate field effect transistors (MUGFETs), diodes, etc. These devices could be formed within a single semiconductor body (e.g., on a single die of an integrated circuit), or could be formed on different integrated circuits (e.g., on two integrated circuits that are mounted on a common circuit board). Thus, isolation structures could include oxide based isolation trenches, but could also include more generic devices for isolation, such as circuit boards or other elements interposed between integrated circuits. Although not illustrated, more than two devices could be thermally coupled to one another by a single member or multiple members.

FIGS. 2A-2G show an example of another circuit 200 that may achieve precise device matching. Generally speaking, FIG. 2A shows a top view (layout view) of the circuit 200, while FIGS. 2B-2G show cross-sectional views of the circuit taken across the sectional lines as indicated. Note that for purposes of clarity and simplicity, not all layers are necessarily illustrated in all of these figures.

FIGS. 2A-2B show the circuit 200 formed over a silicon-on-insulator (SOI) semiconductor body 202. The SOI body 202 comprises a buried oxide region 204 that is formed over a semiconductor substrate 206, wherein silicon (Si) 208 overlies the buried oxide 204.

A first isolation trench 210 surrounds a first region 212 of the silicon, and a second isolation trench 214 surrounds a second region 216 of the silicon. The lower surfaces of the isolation trenches (e.g., 218) may contact the buried oxide layer 204 to facilitate effective isolation between the first and second regions 212, 216.

Due to variations in doping concentration (e.g., due to device features), the first and second regions may exhibit different electrical resistances therein. Thus, the first region 212 may be characterized by a first electrical resistance region 220 and a second electrical resistance region 222, wherein the first electrical resistance region has a higher doping (i.e., lower electrical resistance) than the second electrical resistance region. Similarly, the second region 216 may be characterized by a third electrical resistance region 224 and a fourth electrical resistance region 226, wherein the third electrical resistance region has lower electrical resistance than the fourth electrical resistance region. First and second devices may be formed within the first and third (highly doped, low resistivity) electrical resistance regions 220, 224, respectively.

There are numerous ways in which the various electrical resistance regions could manifest themselves. For example, the first and third electrical resistance regions will often have one doping type (e.g., n-type), while the second and fourth electrical resistance regions will have the opposite doping type (e.g., p-type). In various embodiments, the first and third electrical resistance regions could have approximately the same electrical resistance, which might range from approximately 1E-5 ohms-cm to approximately 1E-2 ohms-cm. In various embodiments, the second and fourth electrical resistance regions could have approximately the same electrical resistance, which might range from approximately 1 ohms-cm to approximately 100 ohms-cm.

To thermally match the two devices, a member 228, which may have one or more fingers, may be configured in one of several locations with respect to the various electrical resistivity regions. For example, in the illustrated embodiment, the member 228 includes one finger 230 that overlies the first and third electrical resistance regions 220, 224 and that spans the silicon body therebetween; and another finger 232 that overlies the second and fourth electrical resistance regions 222, 226 and spans the silicon body therebetween.

Generally speaking, finger 232 may be preferable, because it is positioned over the second and fourth (relatively-high) electrical resistance regions 222, 226 which efficiently provide a mechanism to retain electrical isolation between the devices. More particularly, the finger 232 is electrically separated from the first and third electrical resistance regions 220, 224 by resistances $R_1$ and $R_2$, which contribute to the overall electrical reactance of the member. This finger 232 may be positioned far enough from the first and third electrical resistance regions so that the series resistance $R_1$ and $R_2$ limit the impact of the added capacitance on the devices to acceptable levels.

In real world implementations, these fingers 230, 232 may manifest themselves in various forms. For example, FIGS. 2B-2D show cross sections of some illustrative fingers 230 coupling the first and third electrical resistance regions 220, 224, and FIGS. 2E-2G show cross sections of some illustrative fingers 232 coupling the second and fourth electrical resistance regions 222, 226. It will be appreciated that a member could include any one of these fingers (or a finger not illustrated), as well as any combination of these fingers (and/or other fingers not illustrated).

FIG. 2B illustrates a finger 230A that could overlie the first and third electrical resistance regions 220, 224. The finger 230A includes a metal layer 234 (e.g., metal1). In the first region 212, contacts 236 couple the metal layer 234 to a polysilicon layer 238 that overlies a thin oxide layer 240. In the second region 216, contacts 242 connect the metal layer 234 to optional highly doped active regions 244 in the third electrical resistance region 224. These highly doped active regions 244 are the same doping type (i.e., n-type or p-type) as the surrounding region 224, albeit at a higher concentration. Therefore, during operation, as one of the devices heats up, the heat may pass (q-flow) through the thin oxide 240 and flow between the first and second regions 212, 216. Thus, the thin oxide 240 allows some heat to pass, but still functions as a DC isolation element between the two regions.

FIG. 2C shows another finger 230B similar to finger 230A in FIG. 2B, but wherein the highly doped active regions 244 have not been formed. Because the highly doped active regions 244 may facilitate "ohmic" contacts (i.e., stable, low resistivity contacts), the absence of the highly doped active regions may increase the effective electrical reactance of this finger 230B.

FIG. 2D illustrates another finger 230C that comprises a polysilicon layer 246. In this embodiment, the heat flows across two oxide layers 248, 250.

FIG. 2E illustrates another finger 232A that spans the second and fourth electrical resistance regions 222, 226, and which comprises a first metal layer 252 and a second metal layer 254. In the first region 212, contacts 256 and optional highly doped active regions 258 couple the first metal layer 252 to the second electrical resistance region 222. In the second region 216, contacts 260, vias 262, and optional highly doped active regions 264 couple the second metal layer 254 to the fourth electrical resistance region 226. The finger 232A also includes an interlevel dielectric 266 that separates the first metal layer 252 from the second metal layer 254. Thus, to facilitate precise matching of the devices, heat can flow over the finger 232A by flowing through the dielectric 266.

FIG. 2F illustrates another finger 232B that comprises a polysilicon layer 268 and metal layers 269, 271. Again, the finger 232B may be configured such that heat flows between the first and second regions 212, 214 by traversing the thin oxide layers 270, 272. The metal layers 269, 271 are optional, although they tend to improve lateral heat conduction.

FIG. 2G illustrates another finger 232C that comprises a metal layer 274 and contacts 276. The finger 232C may also include optional highly doped active areas 278.

FIGS. 3A-3C illustrate another embodiment 300 wherein the first and second devices comprise first and second bipolar devices. Aspects of the invention may be particularly useful for bipolar devices, which are often used in circuits wherein very precisely matched device characteristics are required. In addition, bipolar transistors are often formed inside of their own shallow-trench isolation structure (i.e., only one bipolar device in each shallow-trench isolation structure), such that large thermal offsets may tend to occur. NPN bipolar transistors 302, 304 are formed in the semiconductor body, wherein each transistor comprises three terminals, namely an n-type emitter 306; a p-type base (which includes a highly doped p+ region 308 and a lower doped shallow p-well 310); and an n-type collector 312. A deep n-well 314, a deep n-contact 316, and a highly doped buried n-layer 318 serve to more uniformly connect the collectors to the base. In other embodiments, the bipolar transistors would have the doping conventions reversed (i.e., in PNP transistor embodiments).

A member 320 comprising three interdigitated fingers 322, 324, 326, thermally couples the transistors to one another. The first and second interdigitated fingers 322, 324 comprise first and second metal layers, such as previously discussed with respect to FIG. 2E. The third interdigitated finger comprises a polysilicon layer and metal layers such as previously discussed with respect to FIG. 2F. Therefore, in this embodiment, an integrated circuit designer can have a variety of fingers that couple heat between two devices, with the highest reactance fingers nearest to the devices and the lowest reactance fingers furthest from the devices.

Thus, in one embodiment, the lowest reactance fingers (wherein reactance is related to the resistance and capacitance associated with the fingers) can be furthest away from the transistors and the highest reactance fingers can be closer to the transistors. A designer will want to limit the electrical effect of the fingers on the behavior of the circuit while maximizing the effect they will have on the thermal characteristics.

Figure 4:
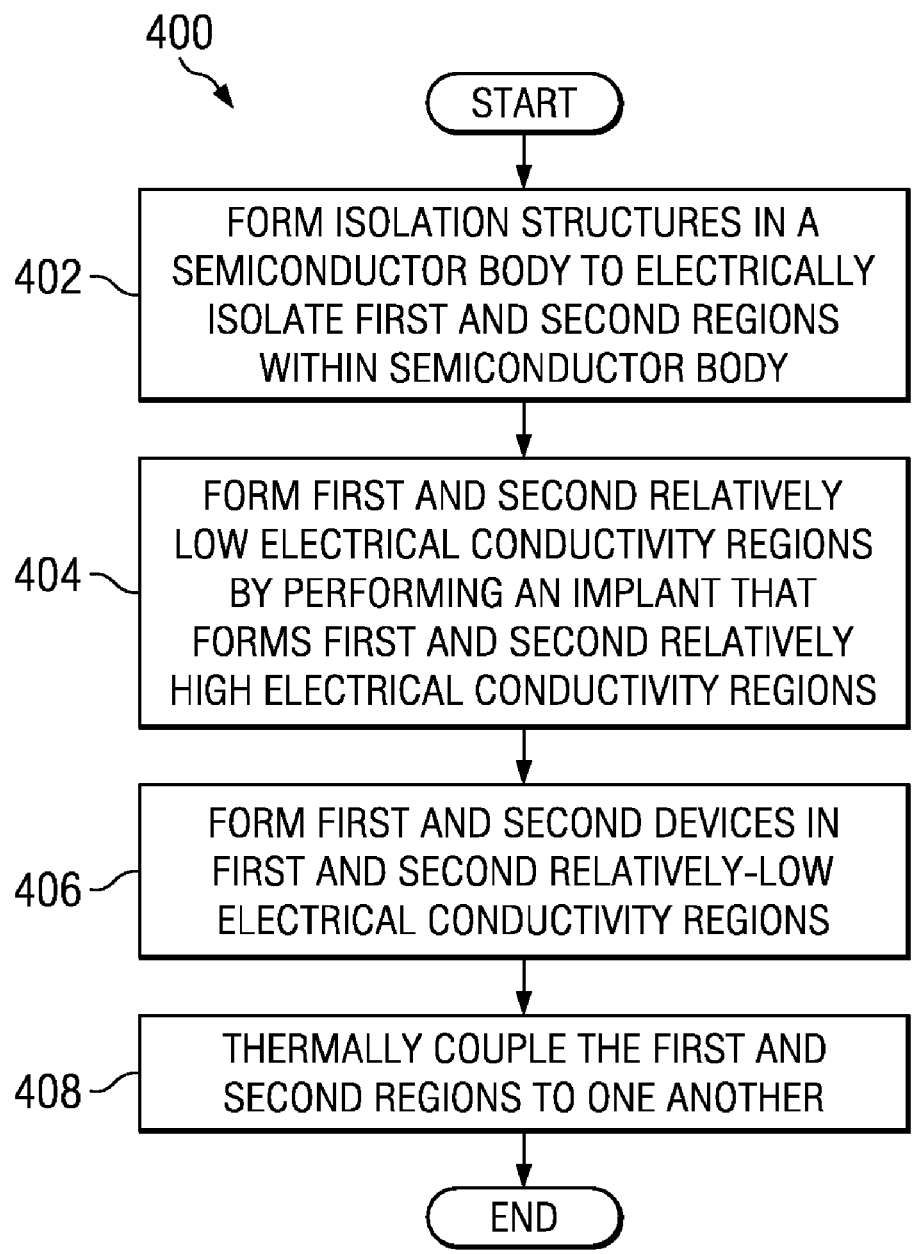
FIG. 4 shows a flow chart in accordance with aspects of the invention.

In order to aid in the successful manufacturing of matched transistors, aspects of the invention relate to a method 400 for manufacturing such transistors as illustrated in FIG. 4. While this method is illustrated and described below as a series of acts or events, it will be appreciated that the invention is not limited by the illustrated ordering of such acts or events. For example, some acts may occur in different orders and/or concurrently with other acts or events apart from those illustrated and/or described herein. In addition, not all illustrated steps may be required to implement a methodology in accordance with one or more aspects or embodiments of the invention. Further, one or more of the acts depicted herein may be carried out in one or more separate acts and/or phases.

In 402, isolation structures are formed in a semiconductor body to electrically isolate first and second regions within the semiconductor body. In one embodiment, these isolation structures are isolation trenches that are formed by etching the semiconductor body to form a recess, and then filling the recess with dielectric material.

In 404, first and second relatively high electrical resistance regions are formed. Formation of the first and second relatively high electrical resistance regions could be accomplished by masking off these regions, and then performing an implant. This implant could decrease the electrical resistance (i.e., increase the electrical conductivity) of the implanted regions such that the masked regions have a relatively high electrical resistance.

In 406, first and second devices could be formed within the first and second relatively low electrical resistance regions. As mentioned, the devices could include MOSFETs, BJTs, JFETs, MUGFETs, diodes, or other semiconductor devices. Therefore, suitable steps could be used to make these devices. In a typical embodiment, the devices will be formed such that they have matched geometries.

Finally, in 408, the first and second regions are thermally coupled to one another. In one embodiment, the member thermally couples the regions while providing a resistive element that retains electrical isolation between the devices.

Although the invention has been illustrated and described with respect to one or more implementations, those skilled in the art to which the invention relates will appreciate that alterations and/or modifications may be made to the illustrated examples without departing from the spirit and scope of the claimed invention.

What is claimed is:

1. A semiconductor device, comprising:
   a semiconductor substrate;
   first and second isolation trenches formed in the semiconductor substrate surrounding and electrically isolating first and second regions of the semiconductor substrate;
   the first and second regions each including a lower electrical resistance subregion and a higher electrical resistance subregion;
   first and second geometrically matched transistors respectively formed within the lower electrical resistance subregions of the first and second regions; and
   a finger member comprising thermally conductive material overlying the higher electrical resistance subregions of the first and second regions, laterally spaced from the lower electrical resistance subregions of the first and second regions, and spanning the semiconductor substrate over the first and second isolation trenches between the first and second regions.

2. The device of claim 1, wherein the lower electrical resistance subregions have first doping concentrations and the higher electrical resistance subregions have second doping concentrations that are lower than the respective first doping concentrations.

3. The device of claim 1, further comprising contacts that respectively couple the finger member to the higher electrical resistance subregions of the first and second regions.

4. The device of claim 1, wherein the finger member is a first finger member, and the device further comprises a second finger member comprising thermally conductive material overlying the lower electrical resistance subregions and spanning the semiconductor substrate over the first and second isolation trenches between the first and second regions.

5. The device of claim 4, wherein the first finger member comprises a relatively low reactance finger member and the second finger member comprises a relatively high reactance finger member.

6. The device of claim 4, wherein the first and second finger members comprise a polysilicon layer; the device further comprises an oxide layer that separates the polysilicon layer from the semiconductor substrate; and the polysilicon layer is configured so that heat is exchanged between the first and second devices by transference through the oxide layer into the first and second fingers.

7. The device of claim 4, wherein the first and second finger members comprise a metal layer; and the device further comprises contacts connecting the metal layer to the semiconductor substrate.

8. The device of claim 7, wherein the first finger member comprises a first metal layer; the second finger member comprises a second metal layer; and the contacts comprises first contacts connecting the first metal layer to the semiconductor substrate and second contacts connecting the second metal layer to the semiconductor substrate; and the device further comprises a dielectric layer isolating the second metal layer from the first metal layer.

9. The device of claim 1, wherein the first and second transistors comprise bipolar junction transistors.

10. The device of claim 1, wherein the finger member comprises a metal layer; and the device further comprises contacts respectively coupling the metal layer to a polysilicon layer over the higher electrical resistance subregions of the first and second regions.

11. A semiconductor device, comprising:

a semiconductor substrate;

first and second isolation trenches formed in the semiconductor substrate surrounding and electrically isolating first and second regions of the semiconductor substrate;

the first and second regions each including a lower electrical resistance subregion and a higher electrical resistance subregion;

first and second transistors respectively formed in the lower electrical resistance subregions of the first and second regions;

at least one thermally conductive member overlying the higher electrical resistance subregions of the first and second regions, laterally spaced from the lower electrical resistance subregions of the first and second regions, and spanning the semiconductor substrate over the first and second isolation trenches to conduct heat between the first and second regions.

12. The device of claim 11, wherein the at least one thermally conductive member comprises at least one first finger member including a first insulating layer formed over the semiconductor substrate; a first metal layer formed over the insulating layer; and at least one first contact formed through the first insulating layer between the first metal layer and the higher electrical resistance subregion of one of the first and second regions.

13. The device of claim 12, wherein the at least one first finger member further includes a second insulating layer formed over the first metal layer; and a second metal layer formed over the second metal layer.

14. The device of claim 13, wherein the at least one first finger member further includes at least one second contact formed through the first and second insulating layers between the second metal layer and the higher electrical resistance subregion of the other of the first and second regions.

15. The device of claim 14, wherein the at least one first contact contacts a corresponding at least one first highly doped region formed within the higher electrical resistance subregion of the first region; and the at least one second contact contacts a corresponding at least one second highly doped region formed within the higher electrical resistance subregion of the second region.

16. The device of claim 14, wherein the at least one thermally conductive member further comprises at least one second finger member including a polysilicon layer formed overlying the higher electrical resistance subregions of the first and second regions, laterally spaced from the lower electrical resistance subregions of the first and second regions, and spanning the semiconductor substrate over the first and second isolation trenches.

17. The device of claim 16, wherein the at least one second finger member further includes the first insulating layer formed over the polysilicon layer; the first metal layer formed over the first insulating layer; and at least one third contact formed through the first insulating layer between the first metal layer and the polysilicon layer.

18. The device of claim 17, wherein the at least one second finger member further includes the second insulating layer formed over the first metal layer; the second metal layer formed over the second insulating layer; and at least one fourth contact formed through the second insulating layer between the second metal layer and the first metal layer.

19. The device of claim 11, wherein the at least one thermally conductive member further comprises at least one finger member including a polysilicon layer formed overlying the higher electrical resistance subregions of the first and second regions, laterally spaced from the lower electrical resistance subregions of the first and second regions, and spanning the semiconductor substrate over the first and second isolation trenches.

20. The device of claim 19, wherein the at least one finger member further includes an insulating layer formed over the polysilicon layer; a metal layer formed over the insulating layer; and at least one contact formed through the insulating layer between the metal layer and the polysilicon layer.

* * * * *